(12) United States Patent
Hashizume

(10) Patent No.: US 10,539,862 B2
(45) Date of Patent: Jan. 21, 2020

(54) WAVELENGTH CONVERSION ELEMENT, WAVELENGTH CONVERTER, LIGHT SOURCE APPARATUS, AND PROJECTOR

(71) Applicant: SEIKO EPSON CORPORATION, Tokyo (JP)

(72) Inventor: Toshiaki Hashizume, Okaya (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/991,420

(22) Filed: May 29, 2018

(65) Prior Publication Data

US 2018/0356716 A1    Dec. 13, 2018

(30) Foreign Application Priority Data

Jun. 7, 2017 (JP) ................. 2017-112598

(51) Int. Cl.

| | |
|---|---|
| *G03B 21/20* | (2006.01) |
| *H01L 33/50* | (2010.01) |
| *H04N 9/31* | (2006.01) |
| *H01S 5/06* | (2006.01) |
| *G02B 27/30* | (2006.01) |
| *G02B 26/00* | (2006.01) |
| *H04N 9/04* | (2006.01) |
| *G03B 21/16* | (2006.01) |

(52) U.S. Cl.
CPC ......... *G03B 21/204* (2013.01); *G02B 26/008* (2013.01); *G02B 27/30* (2013.01); *H01L 33/502* (2013.01); *H01S 5/0609* (2013.01); *H04N 9/04521* (2018.08); *H04N 9/3158* (2013.01); *G03B 21/16* (2013.01)

(58) Field of Classification Search
CPC ...... G03B 21/204; G03B 21/16; G02B 27/30; G02B 26/008; H01L 33/502; H01S 5/0609; H04N 9/3158; H04N 9/04521
See application file for complete search history.

(56) References Cited

U.S. PATENT DOCUMENTS

2007/0262335 A1    11/2007    Kumei et al.
2009/0213591 A1    8/2009    Katabe et al.
(Continued)

FOREIGN PATENT DOCUMENTS

JP    2006-287132 A    10/2006
JP    2015-088636 A    5/2015
(Continued)

OTHER PUBLICATIONS

English translation of JP 2016-170349 A. (Year: 2016).*

Primary Examiner — Cara E Rakowski
Assistant Examiner — Magda Cruz
(74) Attorney, Agent, or Firm — Oliff PLC

(57) ABSTRACT

A wavelength conversion element includes a wavelength conversion layer containing a plurality of phosphor particles and an inorganic binder that bonds the phosphor particles to each other and a substrate that holds the wavelength conversion layer and contains alumina and air cavities. The substrate has an apparent air cavity ratio that is greater than or equal to 10% and smaller than or equal to 30%. The substrate has a median diameter of particles of the alumina that is greater than or equal to 0.1 μm and smaller than or equal to 1.0 μm.

12 Claims, 10 Drawing Sheets

(56) References Cited

U.S. PATENT DOCUMENTS

| | | | |
|---|---|---|---|
| 2013/0257264 A1* | 10/2013 | Tamaki | B05D 5/06 |
| | | | 313/503 |
| 2015/0116671 A1 | 4/2015 | Kuroi et al. | |
| 2015/0171372 A1* | 6/2015 | Iwata | H01L 33/501 |
| | | | 257/40 |
| 2016/0123557 A1 | 5/2016 | Ku et al. | |
| 2016/0149097 A1* | 5/2016 | Saka | C23C 16/4417 |
| | | | 257/98 |
| 2016/0238922 A1* | 8/2016 | Furuyama | G02B 26/008 |
| 2018/0003363 A1 | 1/2018 | Furuyama | |

FOREIGN PATENT DOCUMENTS

| | | | | |
|---|---|---|---|---|
| JP | 2015-215583 A | 12/2015 | | |
| JP | 2016-157905 A | 9/2016 | | |
| JP | 2016-170349 A | 9/2016 | | |
| JP | 2016170349 A * | 9/2016 | | G02B 5/20 |
| JP | 2017-90797 A | 5/2017 | | |
| JP | 2017-149632 A | 8/2017 | | |
| JP | 2017-219817 A | 12/2017 | | |
| JP | 2018-2488 A | 1/2018 | | |
| WO | 39/00351 A2 | 1/1989 | | |
| WO | 2018016357 A1 | 1/2018 | | |

\* cited by examiner

WAVELENGTH CONVERSION ELEMENT, WAVELENGTH CONVERTER, LIGHT SOURCE APPARATUS, AND PROJECTOR

BACKGROUND

1. Technical Field

The present invention relates to a wavelength conversion element, a wavelength converter, a light source apparatus, and a projector.

2. Related Art

As a light source apparatus used in a projector, there is a proposed light source apparatus using fluorescence emitted from a phosphor irradiated with excitation light outputted from a semiconductor layer or any other light emitting device.

For example, JP-A-2015-215583 discloses a fluorescing wheel used for a projector and including a ceramic substrate, a phosphor layer provided on a first surface of the substrate, and a reflection layer provided on a second surface of the substrate. In JP-A-2015-215583, a glass binder in which phosphor particles are dispersed is presented as an example of the phosphor layer, and a metal reflection layer made, for example, of silver or aluminum and a reflective glass layer are presented as examples of the reflection layer. In the fluorescing wheel, fluorescence that exits out of the phosphor layer toward the substrate passes through the substrate, is then reflected off the reflection layer, and travels through the substrate again toward the phosphor layer.

In the fluorescing wheel disclosed in JP-A-2015-215583, the phosphor layer is provided on the ceramic substrate having high thermal conductivity and including the reflection layer. Specifically, the phosphor layer is fixed to the substrate, which includes the reflection layer, such as a metal reflection layer and a reflective glass layer, for example, in a welding process. In the case where a metal reflection layer is used as the reflection layer, there is a problem of a decrease in reflectance of the fluorescence reflected off the metal reflection layer as a result of oxidation of the surface thereof due to the heat generated when the phosphor layer is welded onto the substrate. In the case where a reflective glass layer is used as the reflection layer, it is difficult to increase the reflectance by increasing the number of inorganic particles or air cavities contained in the glass. When air cavities are used, in particular, too large a number of air cavities undesirably result in a decrease in the thermal conductivity of the reflection layer.

To increase the fluorescence extraction efficiency, a phosphor and a binder having refractive indices different from each other are combined with each other as the material of the phosphor layer, the phosphor layer is configured to also contain air cavities, and other methods are used in some cases. In any of the cases described above, however, part of the fluorescence reflected off the metal reflection surface is reflected off the interface between media having refractive indices different from each other in the phosphor layer and returns to the metal reflection surface again. Part of the fluorescence is absorbed by free electrons in the reflection layer in the course of the process in which the fluorescence travels back and forth between the phosphor layer and the reflection layer, undesirably resulting in a decrease in the amount of fluorescence extracted out of the phosphor layer.

SUMMARY

An advantage of some aspects of the invention is to provide a wavelength conversion element that produces high-intensity fluorescence. Another advantage of some aspects of the invention is to provide a wavelength converter including the wavelength conversion element described above. Another advantage of some aspects of the invention is to provide a light source apparatus including the wavelength conversion element or the wavelength converter described above. Another advantage of some aspects of the invention is to provide a projector including the light source apparatus described above.

A wavelength conversion element according to an aspect of the invention includes a wavelength conversion layer containing a plurality of phosphor particles and an inorganic binder that bonds the phosphor particles to each other and a substrate that holds the wavelength conversion layer and is made of alumina containing air cavities. The substrate has an apparent air cavity ratio that is greater than or equal to 10% and smaller than or equal to 30%. The substrate has a median diameter of particles of the alumina that is greater than or equal to 0.1 µm and smaller than or equal to 1.0 µm.

According to the wavelength conversion element according to the aspect of the invention, since the median diameter of the alumina particles that form the substrate is relatively small, a substrate containing relatively small air cavities is provided. A wavelength conversion element including a substrate having high reflectance and high thermal conductivity can therefore be achieved. High-intensity fluorescence can therefore be produced. The significance of the numerical ranges of the apparent air cavity ratio of the alumina and the median diameter of the alumina particles will be described later.

In the wavelength conversion element according to the aspect of the invention, the apparent air cavity ratio may be greater than or equal to 15% and smaller than or equal to 25%.

According to the configuration described above, high reflectance and high thermal conductivity can be sufficiently ensured.

In the wavelength conversion element according to the aspect of the invention, the median diameter of the alumina particles may be greater than or equal to 0.1 µm and smaller than or equal to 0.7 µm.

According to the configuration described above, a substrate having high reflectance and high thermal conductivity can be achieved even when the alumina is burned at a relatively low temperature.

A wavelength converter according to another aspect of the invention includes the wavelength conversion element according to the aspect of the invention and a rotary driver that rotates the wavelength conversion element around an axis of rotation perpendicular to a surface of the substrate.

According to the configuration described above, since the wavelength conversion element can be efficiently cooled, the efficiency at which excitation light is converted into fluorescence can be increased.

A light source apparatus according to another aspect of the invention includes the wavelength conversion element according to the aspect of the invention and an excitation light source that outputs excitation light for exciting the wavelength conversion layer.

The light source apparatus according to the aspect of the invention, which includes the wavelength conversion element according to the aspect of the invention, can produce high-intensity fluorescence.

A light source apparatus according to another aspect of the invention includes the wavelength converter according to the aspect of the invention and an excitation light source that outputs excitation light for exciting the wavelength conversion layer.

The light source apparatus according to the aspect of the invention, which includes the wavelength converter according to the aspect of the invention, can produce high-intensity fluorescence.

A projector according to another aspect of the invention includes the light source apparatus according to the aspect of the invention, a light modulator that modulates light from the light source apparatus in accordance with image information to form image light, and a projection system that projects the image light.

According to the configuration described above, a projector that produces a bright image can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will be described below with reference to the drawings.

In the following drawings, components are drawn at different dimensional scales in some cases for clarity of each of the components.

An example of a projector according to the present embodiment will be described.

The projector in the present embodiment is a projection-type image display apparatus that displays color video images on a screen (projection surface). The projector includes three liquid crystal light modulators corresponding to color light fluxes, red light, green light, and blue light. The projector further includes a semiconductor laser capable of producing high-luminance, high-power light as a light source of an illuminator.

Figure 1:
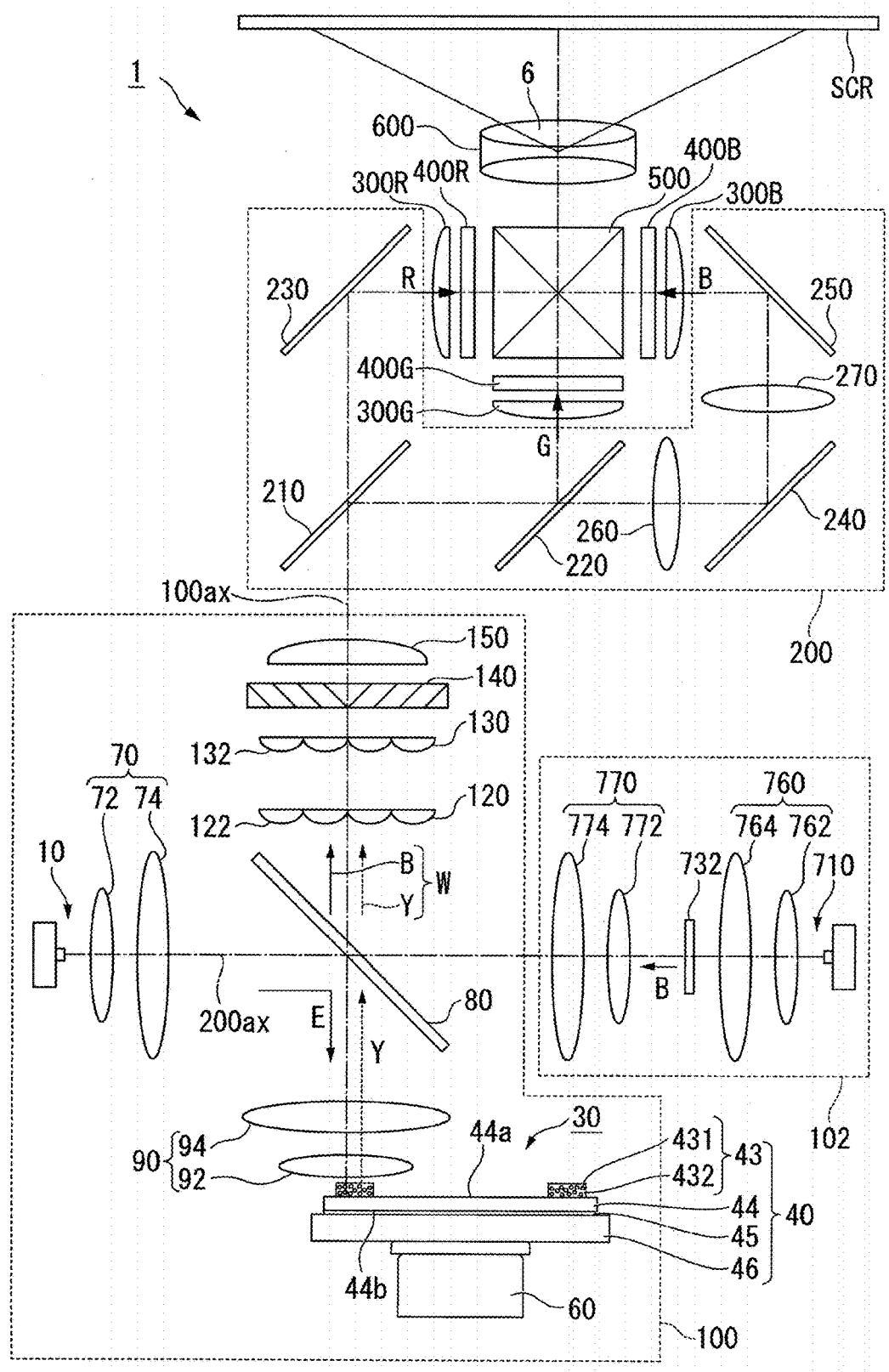
FIG. 1 is a schematic configuration diagram of a projector according to an embodiment of the invention.

FIG. 1 is a schematic view showing the optical system of the projector according to the present embodiment.

The projector 1 includes a first light source apparatus 100, a second light source apparatus 102, a color separation/light guide system 200, a liquid crystal light modulator 400R, a liquid crystal light modulator 400G, a liquid crystal light modulator 400B, and cross dichroic prism 500, and a projection system 600, as shown in FIG. 1.

The first light source apparatus 100 in the present embodiment corresponds to the light source apparatus in the appended claims.

The first light source apparatus 100 includes a first light source 10, a collimation system 70, a dichroic mirror 80, a collimation/light collection system 90, a wavelength converter 30, a first lens array 120, a second lens array 130, a polarization conversion element 140, and a superimposing lens 150.

The first light source 10 in the present embodiment corresponds to the excitation light source in the appended claims. The wavelength converter 30 in the present embodiment corresponds to the wavelength converter in the appended claims.

The first light source 10 is formed of a semiconductor laser that outputs blue excitation light E having an intensity that peaks at a wavelength of 445 nm. The first light source 10 may be formed of a single semiconductor laser or a plurality of semiconductor lasers. The first light source 10 may instead be formed of a semiconductor laser that outputs blue excitation light having an intensity that peaks, for example, at a wavelength of 460 nm in place of the peak wavelength of 445 nm. The first light source 10 is so disposed that an optical axis 200ax of the excitation light E outputted from the first light source 10 is perpendicular to an illumination optical axis 100ax.

The collimation system 70 includes a first lens 72 and a second lens 74. The collimation system 70 roughly parallelizes the light outputted from the first light source 10. The first lens 72 and the second lens 74 are each formed of a convex lens.

The dichroic mirror 80 is so disposed in the light path between the collimation system 70 and the collimation/light collection system 90 as to incline by an angle of 45° with respect to the optical axis 200*ax* and the illumination optical axis 100*ax*. The dichroic mirror 80 reflects the blue excitation light E outputted from the first light source 10 and transmits yellow fluorescence Y emitted from the wavelength converter 30, which will be described later.

The collimation/light collection system 90 has the function of focusing the excitation light E reflected off the dichroic mirror 80 and causing the focused excitation light E to be incident on a wavelength conversion element 40, which will be described later, and the function of roughly parallelizing the fluorescence Y emitted from the wavelength conversion element 40 and causing the roughly parallelized fluorescence Y to be incident on the dichroic mirror 80. The collimation/light collection system 90 includes a first lens 92 and a second lens 94. The first lens 92 and the second lens 94 are each formed of a convex lens.

The second light source apparatus 102 includes a second light source 710, a light collection system 760, a diffuser plate 732, and a collimation system 770.

The second light source 710 is formed of a semiconductor laser identical to the semiconductor laser that forms the first light source 10. In the case where the first light source 10 is formed of a semiconductor laser that outputs light having an intensity that peaks at the wavelength of 445 nm, the second light source 710 may instead be formed of a semiconductor laser that outputs light having an intensity that peaks at the wavelength of 460 nm. The second light source 710 may be formed of a single semiconductor laser or a plurality of semiconductor lasers.

The light collection system 760 includes a first lens 762 and a second lens 764. The light collection system 760 collects blue light B outputted from the second light source 710 on the diffuser plate 732 or in the vicinity of the diffuser plate 732. The first lens 762 and the second lens 764 are each formed of a convex lens.

The diffuser plate 732 diffuses the blue light B from the second light source 710 to produce blue light B having a light orientation distribution close to the light orientation distribution of the fluorescence Y emitted from the wavelength converter 30. The diffuser plate 732 can, for example, be a ground glass plate made of optical glass.

The collimation system 770 includes a first lens 772 and a second lens 774. The collimation system 770 roughly parallelizes the light having exited out of the diffuser plate 732. The first lens 772 and the second lens 774 are each formed of a convex lens.

The blue light B outputted from the second light source apparatus 102 is reflected off the dichroic mirror 80 and combined with the fluorescence Y having passed through the dichroic mirror 80 into white light W. The white light W is incident on the first lens array 120.

The first lens array 120 includes a plurality of first lenses 122 for dividing the light from the dichroic mirror 80 into a plurality of sub-light fluxes. The plurality of first lenses 122 are arranged in a matrix in a plane perpendicular to the illumination optical axis 100*ax*.

The second lens array 130 includes a plurality of second lenses 132 corresponding to the plurality of first lenses 122 in the first lens array 120. The second lens array 130, along with the downstream superimposing lens 150, forms images of the first lenses 122 in the first lens array 120 in the vicinity of an image formation region of each of the liquid crystal light modulators 400R, 400G, and 400B. The plurality of second lenses 132 are arranged in a matrix in a plane perpendicular to the illumination optical axis 100*ax*.

The polarization conversion element 140 converts the divided sub-light fluxes from the first lens array 120 into linearly polarized light fluxes having an aligned polarization direction. The polarization conversion element 140 includes, although not shown, polarization separation layers, reflection layers, and retardation layers.

The superimposing lens 150 collects the sub-light fluxes having exited out of the polarization conversion element 140 and superimposes the collected sub-light fluxes on one another in the vicinity of the image formation region of each of the liquid crystal light modulators 400R, 400G, and 400B. The first lens array 120, the second lens array 130, and the superimposing lens 150 form an optical integration system that homogenizes the in-plane optical intensity distribution of the light from the wavelength converter 30.

The color separation/light guide system 200 includes a dichroic mirror 210, a dichroic mirror 220, a reflection mirror 230, a reflection mirror 240, a reflection mirror 250, a relay lens 260, and a relay lens 270. The color separation/light guide system 200 separates the white light W produced from the light from the first light source apparatus 100 and the light from the second light source apparatus 102 into red light R, green light G, and blue light B and guides the red light R, the green light G, and the blue light B to the corresponding liquid crystal light modulators 400R, 400G, and 400B.

A field lens 300R is disposed between the color separation/light guide system 200 and the liquid crystal light modulator 400R. A field lens 300G is disposed between the color separation/light guide system 200 and the liquid crystal light modulator 400G. A field lens 300B is disposed between the color separation/light guide system 200 and the liquid crystal light modulator 400B.

The dichroic mirror 210 is a dichroic mirror that transmits a red light component and reflects a green light component and a blue light component. The dichroic mirror 220 is a dichroic mirror that reflects the green light component and transmits the blue light component. The reflection mirror 230 is a reflection mirror that reflects the red light component. The reflection mirrors 240 and 250 are reflection mirrors that reflect the blue light component.

The red light R having passed through the dichroic mirror 210 is reflected off the reflection mirror 230, passes through the field lens 300R, and is incident on the image formation region of the liquid crystal light modulator 400R. The green light G reflected off the dichroic mirror 210 is reflected off the dichroic mirror 220, passes through the field lens 300G, and is incident on the image formation region of the liquid crystal light modulator 400G. The blue light B having passed through the dichroic mirror 220 travels via the relay lens 260, the light-incident-side reflection mirror 240, the relay lens 270, the light-exiting-side reflection mirror 250, and the field lens 300B, and is incident on the image formation region of the liquid crystal light modulator 400B.

The liquid crystal light modulators 400R, 400G, and 400B each modulate the color light incident thereon in accordance with image information to form a color image corresponding to the color light. Although not shown, light-incident-side polarizers are disposed on the light incident side of the liquid crystal light modulators 400R, 400G, and 400B. Light-exiting-side polarizers are disposed on the light exiting side of the liquid crystal light modulators 400R, 400G, and 400B.

The cross dichroic prism 500 combines the image light fluxes outputted from the liquid crystal light modulators 400R, 400G, and 400B with one another to form a color image. The cross dichroic prism 500 is formed by bonding four rectangular prisms to each other, and dielectric multilayer films are formed on the roughly X-letter-shaped interfaces between the bonded rectangular prisms.

The color image having exited out of the cross dichroic prism 500 is enlarged and projected by the projection system 600 and forms an image on a screen SCR. The projection system 600 is formed of a plurality of projection lenses 6.

The wavelength converter 30 will be described below in detail.

The wavelength converter 30 includes the wavelength conversion element 40 and a motor 60. The wavelength conversion element 40 includes a wavelength conversion layer 43, a substrate 44, a bonding layer 45, and a support plate 46. The wavelength conversion element 40 emits the fluorescence Y toward the side on which the excitation light E is incident. In this process, the substrate 44 functions as a reflection plate that reflects the fluorescence Y emitted from the wavelength conversion layer 43 toward the substrate 44. That is, the wavelength conversion element 40 in the present embodiment is a reflective wavelength conversion element.

The wavelength conversion layer 43 is formed of a phosphor layer that is excited with the excitation light E outputted from the first light source 10 and emits the yellow fluorescence Y. The wavelength conversion layer 43 contains a plurality of phosphor particles 431 and a glass binder 432, which bonds the phosphor particles 431 to each other. The phosphor particles 431 are each formed of a YAG-based phosphor made of $(Y,Gd)_3(Al,Ga)_5O_{12}$(YAG:Ce), in which Ce is dispersed as an activator.

The glass binder 432 in the present embodiment corresponds to the inorganic binder in the appended claims.

Figure 2:
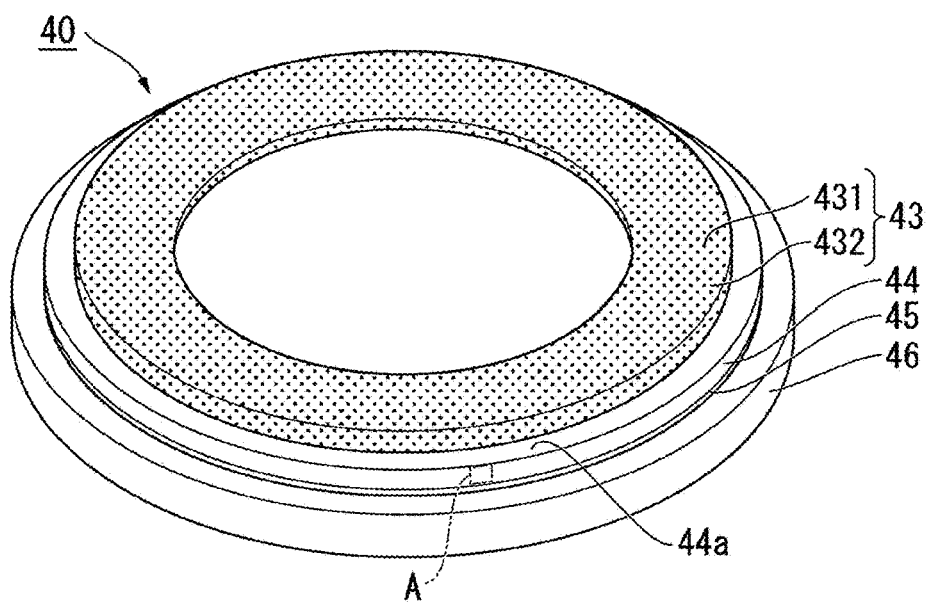
FIG. 2 is a perspective view of a wavelength conversion element in the present embodiment.

As an example, the phosphor particles 431 are YAG particles which each have a diameter ranging from 5 to 40 μm and to which Ce ions having a molar concentration ranging from 0.3 to 2% are added as an activator. The wavelength conversion layer 43 is the glass binder 432 containing the phosphor particles 431 described above at a percent volume concentration ranging from 50 to 750. The glass binder 432 is primarily made, for example, of borosilicate glass. The coefficient of linear expansion of borosilicate glass is about 5 ppm, whereas the coefficient of linear expansion of alumina, of which the substrate 44, which will be described later, is made, is 7 ppm. Appropriate compressive stress is therefore induced in burned borosilicate glass, whereby no cracking occurs. The wavelength conversion layer 43 is formed in an annular shape, as shown in FIG. 2. The wavelength conversion layer 43 has a thickness ranging, for example, from 40 to 200 μm.

The wavelength conversion layer 43 is not necessarily made of a YAG-based phosphor but is desirably made of a garnet-based phosphor. A garnet-based phosphor has thermal conductivity higher than that of any of the other phosphors and has high reliability in a high temperature environment. A garnet-based phosphor therefore emits high-intensity fluorescence even in a case where it is used in a light source apparatus including a stationary wavelength conversion element in place of a rotating-wheel wavelength conversion element.

Figure 3:
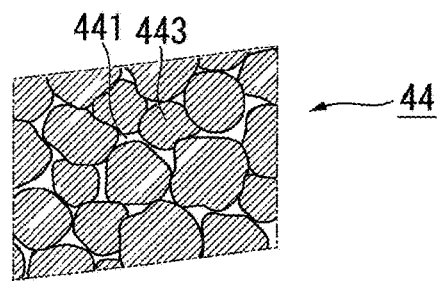
FIG. 3 is an enlarged cross-sectional view of the portion labeled with the reference character A in FIG. 2.

FIG. 3 is an enlarged cross-sectional view of the portion labeled with the reference character A (a part of the substrate 44) in FIG. 2.

The substrate 44 holds the wavelength conversion layer 43 because the wavelength conversion layer 43 is provided on a first surface 44a of the substrate 44. The substrate 44 is formed of alumina containing air cavities 441. Specifically, the substrate 44 has a configuration in which the surfaces of a plurality of alumina particles 443 are bonded to each other, and the gaps between the alumina particles 443 are present as the minute air cavities 441.

The apparent air cavity ratio of alumina is greater than or equal to 10% and smaller than or equal to 30%, and the median diameter of alumina particles is greater than or equal to 0.1 μm and smaller than or equal to 1.0 μm. The apparent air cavity ratio is more desirably greater than or equal to 15% and smaller than or equal to 25%, and the median particle diameter is more desirably greater than or equal to 0.1 μm and smaller than or equal to 0.7 μm.

The apparent air cavity ratio is defined as the percentage of the capacity of air cavities that are open to the capacity of the outer shape. The apparent air cavity ratio can be measured by using the method described in JIS C2141.

The median particle diameter is defined to be the 50% particle diameter in the cumulative distribution determined from the distribution of volumes counted on a particle volume basis. The median particle diameter can be measured by using a laser diffracted scatter method.

The substrate 44 is formed in a disc-like shape, as shown in FIG. 2, and may instead be formed in an annular shape, as is the wavelength conversion layer 43. As an example, the thickness of the substrate 44 is 1 mm, and the diameter of the substrate 44 viewed in the direction of a normal to the first surface 44a ranges, for example, from 30 to 50 mm.

The support plate 46 is bonded to a second surface 44b of the substrate 44 via the bonding layer 45. The support plate 46 is a disc-shaped member made of a material having high thermal conductivity, such as aluminum and copper. The support plate 46 can therefore ensure high heat dissipation capability.

The bonding layer 45 is interposed between the second surface 44b of the substrate 44 and the support plate 46 and bonds the substrate 44 and the support plate 46 to each other. The bonding layer 45 is, for example, a high thermal conductivity adhesive formed of a resin containing high thermal conductivity fine particles. The bonding layer 45 can therefore efficiently transfer heat from the substrate 44 to the support plate 46.

The motor 60 rotates the wavelength conversion element 40 around the axis of rotation perpendicular to the first surface 44a of the substrate 44. In the present embodiment, rotating the wavelength conversion element 40 allows the position where the excitation light E is incident on the wavelength conversion layer 43 to change with time. The rotation of the wavelength conversion element 40 avoids a situation in which the same located on the wavelength conversion layer 43 keeps being irradiated with the excitation light E so that the wavelength conversion layer 43 is locally heated and therefore degraded.

The motor 60 in the present embodiment corresponds to the rotary driver in the appended claims.

A method for manufacturing the wavelength conversion element 40 will be described below.

The method for manufacturing the wavelength conversion element 40 includes the step of producing an alumina plate by performing press working on alumina granules having a median particle diameter greater than or equal to 0.1 μm and smaller than or equal to 1.0 μm, the step of burning the alumina plate at a temperature higher than or equal to 1300° C. and lower than or equal to 1450° C. to produce the substrate 44 made of alumina and containing the air cavities 441, the step of disposing a wavelength conversion material containing the plurality of phosphor particles 431 and the glass binder 432 on the first surface 44a of the substrate 44, and the step of burning the wavelength conversion material disposed on the first surface 44a of the substrate 44 to form the wavelength conversion layer 43 containing the plurality of phosphor particles 431 and the glass binder 432.

First, alumina granules having a median particle diameter ranging from 0.1 to 1 µm are produced from minute alumina powder in a spray drying method using a spray dryer.

Press working is then performed on the alumina granules into a disc shape to produce an alumina plate.

The alumina plate produced in the preceding step is burned at a temperature higher than or equal to 1300° C. and lower than or equal to 1450° C. Alumina is typically burned at about 1600° C. In the present embodiment, however, the burning is performed at a temperature lower than the typical burning temperature. In this case, since the amount of melted portion between alumina granules is small, the alumina granules are so burned that the content of air cavities each having a size roughly equal to the raw-material alumina granules ranges from 15 to 25%. The substrate 44 is thus produced.

Further, since the amount of melted portion between alumina granules is small, the median particle diameter of the alumina particles 443 in the completed substrate 44 is believed to be equal to the median particle diameter of the raw-material alumina granules. The median particle diameter of the alumina particles 443 that form the substrate 44 therefore ranges from 0.1 to 1 µm.

The phosphor particles 431, which are produced by adding Ce ions having the molar concentration ranging from 0.3 to 2% as an activator to the YAG material having the median particle diameter ranging from 5 to 40 µm, glass granules having a median particle diameter smaller than the median particle diameter of the phosphor particles 431, and a solvent are mixed with one another to prepare the wavelength conversion material. The preparation is so performed that the glass granules contain the phosphor particles 431 at the percent volume concentration ranging from 50 to 75%.

The thus prepared wavelength conversion material is placed on the first surface 44a of the substrate 44 by using a printing method or any other method.

The wavelength conversion material placed on the first surface 44a of the substrate 44 is then burned for several minutes at a temperature within a range from about 500 to 900° C., which corresponds to the glass softening point. As a result, the solvent in the wavelength conversion material is evaporated, and the glass granules function as a binder that bonds the phosphor particles 431 to each other, whereby the wavelength conversion layer 43 containing the plurality of phosphor particles 431 and the glass binder 432 is formed. Further, in the course of cooling the glass binder 432, the wavelength conversion layer 43 is reliably fixed onto the substrate 44.

The wavelength conversion element 40 in the present embodiment is thus completed after the steps described above.

An effect of the wavelength conversion element 40 in the present embodiment will be described.

When the wavelength conversion layer 43 is irradiated with the excitation light E, the plurality of phosphor particles 431 in the wavelength conversion layer 43 are excited and emit the fluorescence Y. At this point, conversion of a wavelength of the light in the blue region into a wavelength in the yellow region causes Stokes loss, resulting in heat generation. Further, reabsorption of part of the fluorescence Y performed by the phosphor particles 431 also results in heat generation. The fluorescence Y is emitted in an omnidirectional manner, but the configuration in which the phosphor particles 431 and the glass binder 432 have different refractive indices causes the fluorescence Y to be scattered in the wavelength conversion layer 43 and therefore emitted upward and downward. Further, since the minute air cavities are formed in the glass binder 432, the fluorescence Y is also scattered by the air cavities and emitted as described above. The fluorescence Y emitted upward is used as the illumination light.

On the other hand, the fluorescence Y emitted downward from an arbitrary light emission point in the wavelength conversion layer 43 is incident on the substrate 44. Since a large number of air cavities 441 each having a size roughly equal to the wavelengths of the fluorescence Y are present in the substrate 44, the fluorescence Y is repeatedly reflected off the interfaces between the air cavities 441 and the alumina particles 443, does not pass through the substrate 44, but exits toward the wavelength conversion layer 43 again. The behavior described above is repeated, and the fluorescence Y directed downward also eventually exits upward out of the wavelength conversion layer 43.

The relationship between the size of the alumina particles 443 and the characteristics of the substrate 44 will be described.

Figure 4:
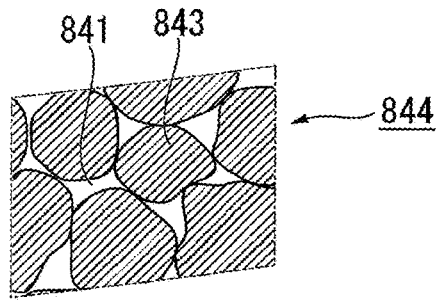
FIG. 4 is an enlarged cross-sectional view of a substrate in Comparative Example.

FIG. 4 is an enlarged cross-sectional view of a substrate in Comparative Example.

In a case where alumina particles 843 are each have relatively large, as in the case of a substrate 844 in Comparative Example shown in FIG. 4, large air cavities 841 are formed between the alumina particles 843 after burned alumina granules are bonded to each other.

In the substrate 844 in Comparative Example, the surface area of the air cavities 841 per unit volume is therefore relatively small. In other words, the area of the interface between the alumina and air is relatively small. Therefore, in the substrate 844 in Comparative Example, the amount of light scattering is small, and the reflectance of the light is low. Further, since the air cavities 841 are each large, the substrate 844 has low thermal conductivity and low mechanical strength.

In contrast, in the case where alumina particles 443 are each relatively small, as in the substrate 44 in the present embodiment shown in FIG. 3, the small air cavities 441 are formed between the alumina particles 443. Further, since the temperature at which the alumina is burned is set to be lower than the typical burning temperature, the melted portion between adjacent alumina particles 443 is not too large, whereby a large number of air cavities 441 are not crushed but left as small air cavities.

As a result, in the substrate 44 in the present embodiment, since the surface area of the air cavities 441 (area of interface between alumina and air) per unit volume is relatively large as compared with the surface area in the substrate 844 in Comparative Example, a large amount of light scattering occurs, and high reflectance is achieved. Further, since the air cavities 441 are smaller than those in the substrate 844 in Comparative Example, the substrate 44 has high thermal conductivity and high mechanical strength.

The present inventor has actually produced prototype substrates having different median diameters of alumina particles and experimentally found the relative relationship between the apparent air cavity ratio of the alumina and the reflectance of light reflected off the alumina, the relative relationship between the apparent air cavity ratio and the thermal conductivity, and the relative relationship between the apparent air cavity ratio and the strength.

Figure 5:
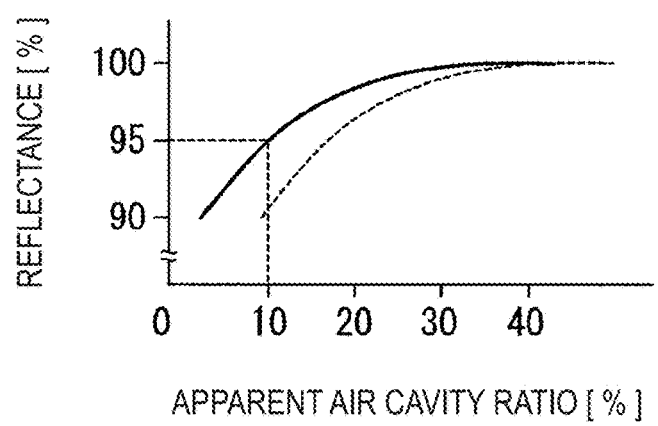
FIG. 5 shows graphs illustrating the relationship between the apparent air cavity ratio of alumina and the reflectance of light reflected off the alumina.

FIG. 5 shows graphs illustrating the relationship between the apparent air cavity ratio of alumina and the reflectance of light reflected off the alumina.

The horizontal axis of FIG. 5 represents the apparent air cavity ratio [%], and the vertical axis of FIG. 5 represents the reflectance [%]. The solid-line graph represents data in a case where the median diameter of the alumina particles is 0.6 µm, and the broken-line graph represents data in a case where the median diameter of the alumina particles is 1.5 µm.

In the case where the median diameter of the alumina particles is 0.6 µm, the reflectance is close to 100% and is roughly constant in the region where the apparent air cavity ratio is about 30% or higher. In the region where the apparent air cavity ratio is 30% or lower, however, the reflectance sharply decreases. In contrast, in the case where the median diameter of the alumina particles is 1.5 µm, the reflectance sharply decreases in the region where the apparent air cavity ratio is 40% or lower, and the reflectance is not roughly constant in the region where the apparent air cavity ratio ranges from 10 to 40%.

For example, it is believed that a typical silver reflection film has a reflectance of about 98%. In the case of the wavelength conversion element 40 in the present embodiment, however, the fluorescence Y from the wavelength conversion layer 43 is reflected multiple times off the substrate 44 and then directed upward out of the wavelength conversion layer 43, and the reflectance therefore needs to be estimated at a lower value than in a simple case where the fluorescence Y is reflected once. Setting the target reflectance at 98% is therefore not realistic. In the case of the wavelength conversion element 40 in the present embodiment, the target reflectance is set at 95% or higher based on the present inventor's findings. To achieve the desired reflectance, FIG. 5 indicates that the apparent air cavity ratio of the alumina needs to be at least 10%.

Figure 6:
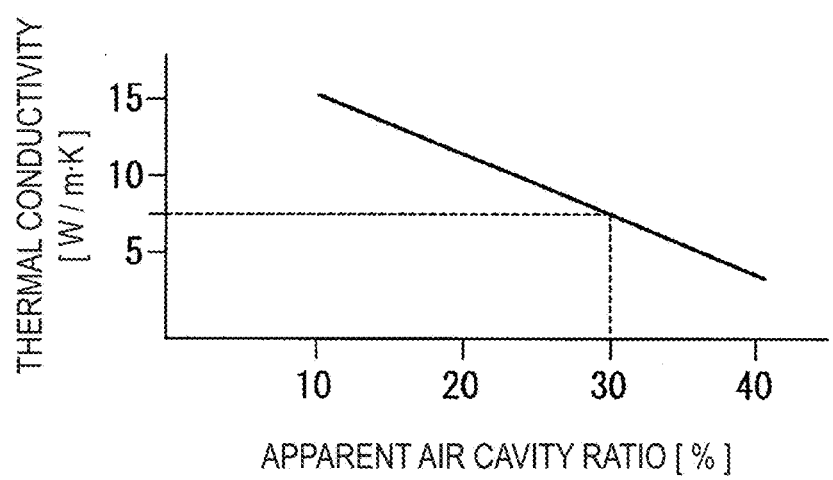
FIG. 6 shows a graph illustrating the relationship between the apparent air cavity ratio of alumina and the thermal conductivity thereof.

FIG. 6 shows a graph illustrating the relationship between the apparent air cavity ratio of the alumina and the thermal conductivity thereof.

The horizontal axis of FIG. 6 represents the apparent air cavity ratio [%], and the vertical axis of FIG. 6 represents the thermal conductivity [W/m·K]. The solid-line graph represents data in the case where the median diameter of the alumina particles is 0.6 µm.

As the apparent air cavity ratio of the alumina increases, the thermal conductivity tends to linearly decreases, as shown in FIG. 6. Since the substrate 44 is produced through the steps of performing press working on alumina granules and burning the alumina granules, as described above, the substrate 44 needs to have a thickness of about 1 mm from the viewpoint of easy handling. In this case, according to calculation made by the present inventor, the substrate 44 needs to have a thermal conductivity of at least about 7 [W/m·K] in consideration of the dimension of the wavelength conversion layer 43, the dimension of the substrate 44, and other factors presented by way of example in the present embodiment. To achieve the desired thermal conductivity, FIG. 6 indicates that the apparent air cavity ratio of the alumina needs to be set at 30% or lower.

Figure 7:
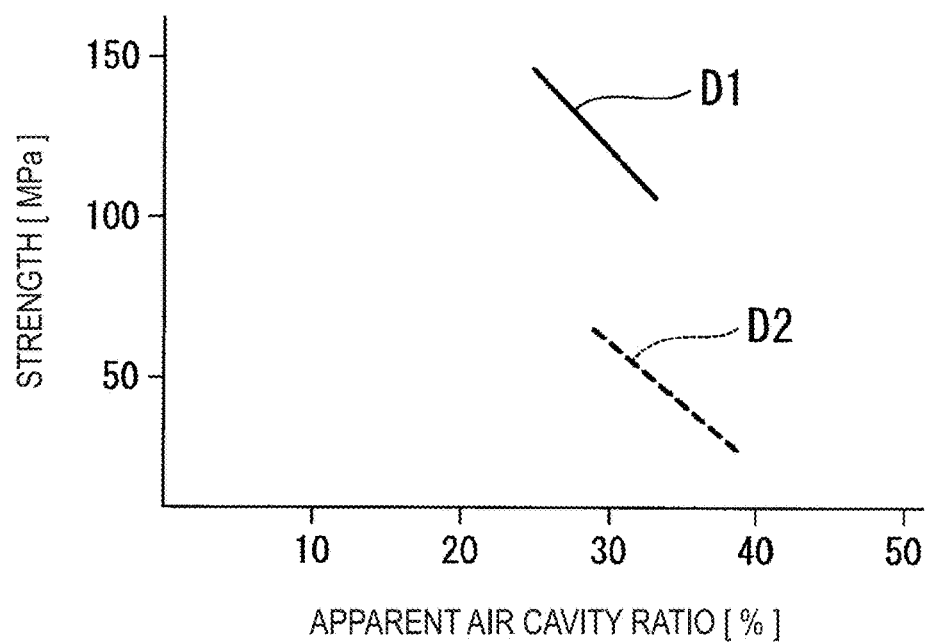
FIG. 7 shows graphs illustrating the relationship between the apparent air cavity ratio of alumina and the strength thereof.

FIG. 7 shows graphs illustrating the relationship between the apparent air cavity ratio of the alumina and the strength thereof.

The horizontal axis of FIG. 7 represents the apparent air cavity ratio [%], and the vertical axis of FIG. 6 represents the strength [MPa]. The solid-line graph D1 represents data in the case where the median diameter of the alumina particles is 0.6 µm, and the broken-line graph D2 represents data in the case where the median diameter of the alumina particles is 1.5 µm.

As the apparent air cavity ratio of the alumina increases, the strength of the alumina decreases, as shown in FIG. 7. On the other hand, as the median diameter of the alumina particles decreases, the strength tends to increase. The substrate 44 is bonded to the support plate 46 via the bonding layer 45, and the coefficient of linear expansion of the substrate 44 and the coefficient of linear expansion of the support plate 46 greatly differ from each other, for example, in a case where the substrate 44 is made of alumina and the support plate 46 is made of aluminum. When the fluorescence Y is produced, the temperature increases so that stress occurs in the substrate 44. The substrate 44 therefore needs to have certain strength. According to calculation made by the present inventor, the substrate 44 needs to have a strength of about 100 MPa or higher in consideration of the dimension of the substrate 44 and other factors shown in the present embodiment. To achieve the desired strength, FIG. 7 indicates that it is necessary to set the apparent air cavity ratio at about 35% or lower in the case where the median diameter of the alumina particles is 0.6 µm and about 25% or lower in the case where the median diameter of the alumina particles is 1.5 µm.

The present inventor has produced substrates under different conditions of the median particle diameters of the alumina particles and the temperature at which the alumina is burned and observed with a scanning electron microscope (SEM) how successfully the alumina particles and the air cavities were produced.

Figure 8A:
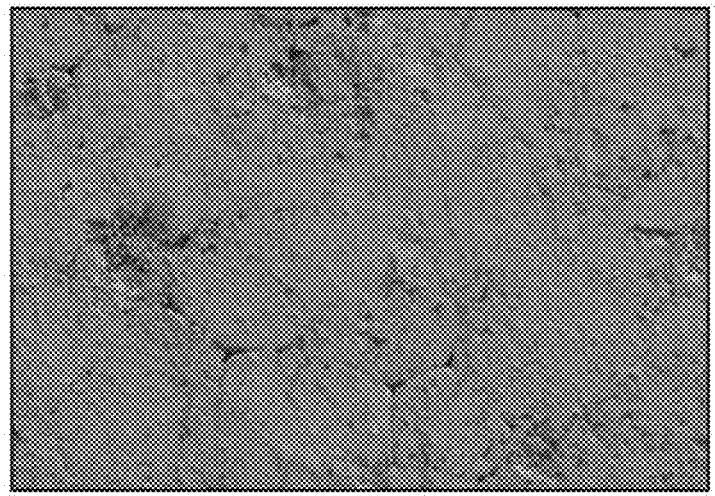
FIG. 8A is a micrograph (magnification of 500) in a case where a substrate in Example 1 was burned at 1300° C.
Figure 8B:
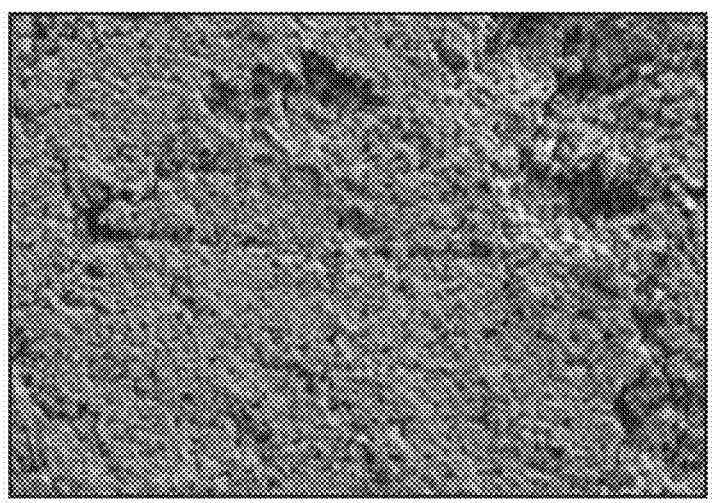
FIG. 8B is a micrograph (magnification of 3000) in the case where the substrate in Example 1 was burned at 1300° C.
Figure 9A:
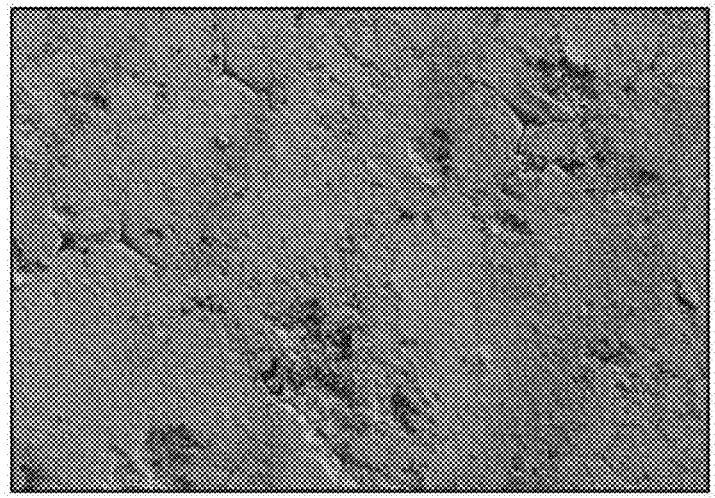
FIG. 9A is a micrograph (magnification of 500) in a case where the substrate in Example 1 was burned at 1350° C.
Figure 9B:
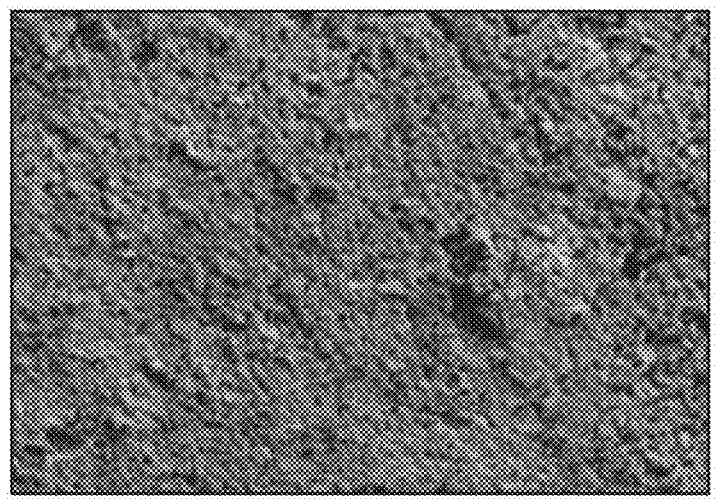
FIG. 9B is a micrograph (magnification of 3000) in a case where the substrate in Example 1 was burned at 1350° C.
Figure 10A:
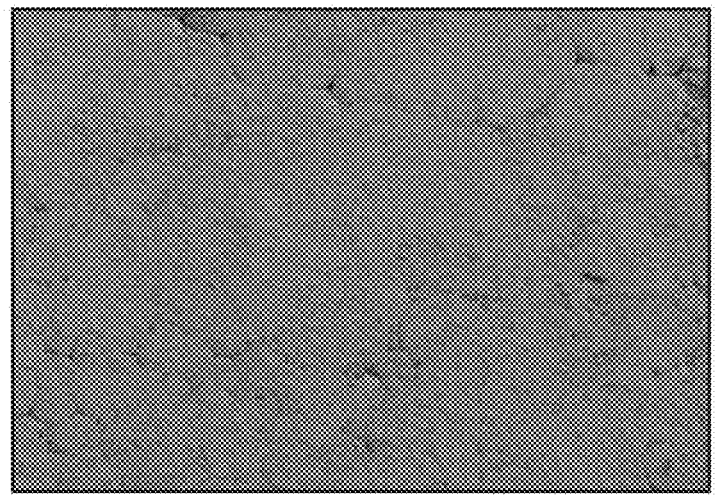
FIG. 10A is a micrograph (magnification of 500) in a case where the substrate in Example 1 was burned at 1400° C.
Figure 10B:
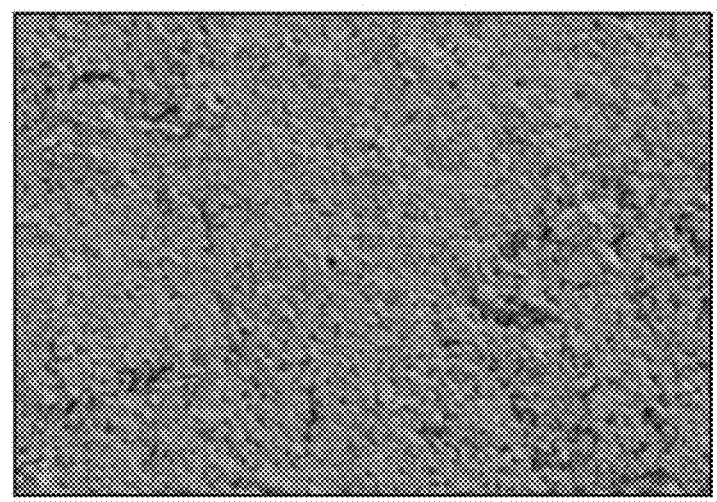
FIG. 10B is a micrograph (magnification of 3000) in the case where the substrate in Example 1 was burned at 1400° C.

FIGS. 8A to 10B show the exterior appearance of substrates in Example 1 that were produced from alumina granules (purity of alumina: 99%) having the median particle diameter of 0.6 µm. FIGS. 8A and 8B show data in a case where the burning temperature was 1300° C. FIGS. 9A and 9B show data in a case where the burning temperature was 1350° C. FIGS. 10A and 10B show data in a case where the burning temperature was 1400° C.

Figure 11A:
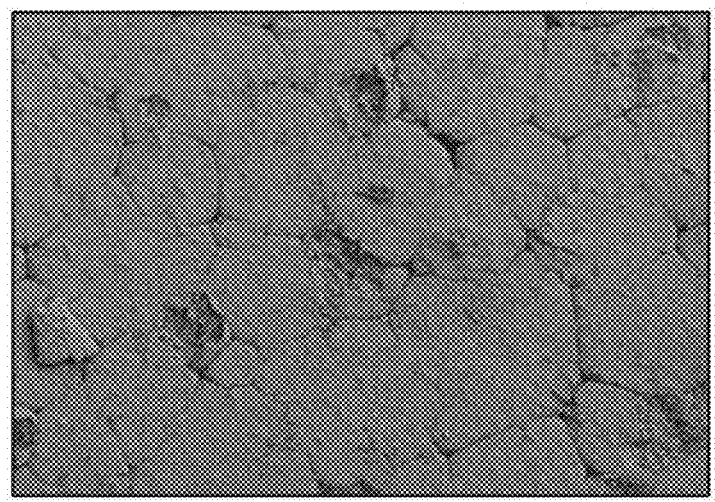
FIG. 11A is a micrograph (magnification of 500) in a case where a substrate in Example 2 was burned at 1300° C.
Figure 11B:
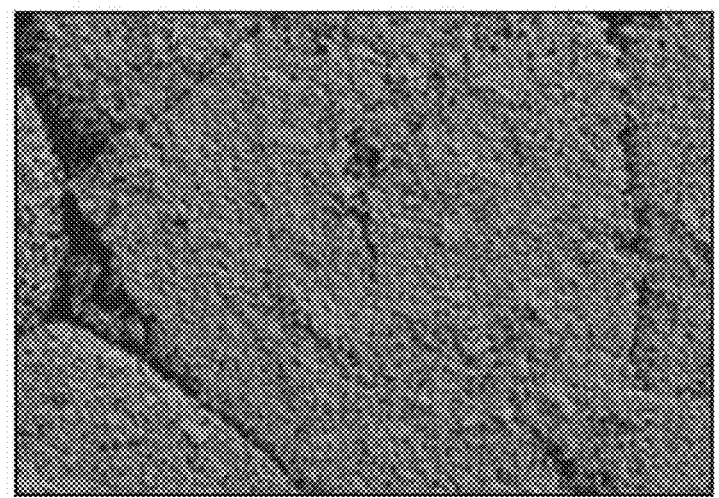
FIG. 11B is a micrograph (magnification of 3000) in the case where the substrate in Example 2 was burned at 1300° C.

FIGS. 11A and 11B show the exterior appearance of substrates in Example 2 that were produced from alumina granules (purity of alumina: 99.9%) having a median particle diameter of 0.2 µm and show data in the case where the burning temperature was 1400° C.

Figure 12A:
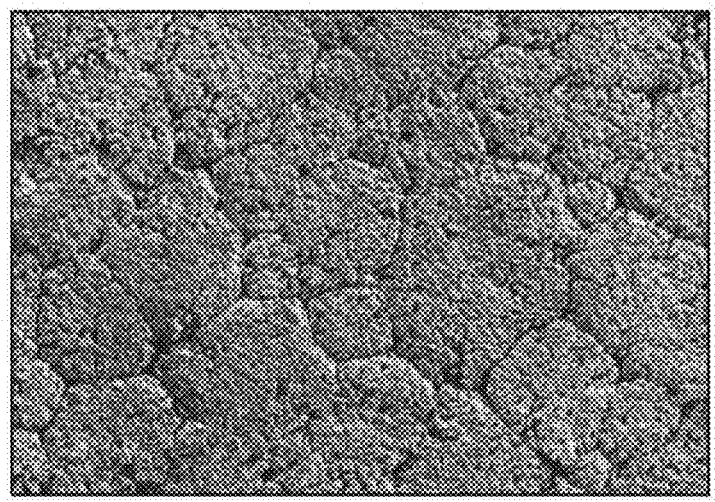
FIG. 12A is a micrograph (magnification of 500) in a case where a substrate in Comparative Example 1 was burned at 1300° C.
Figure 12B:
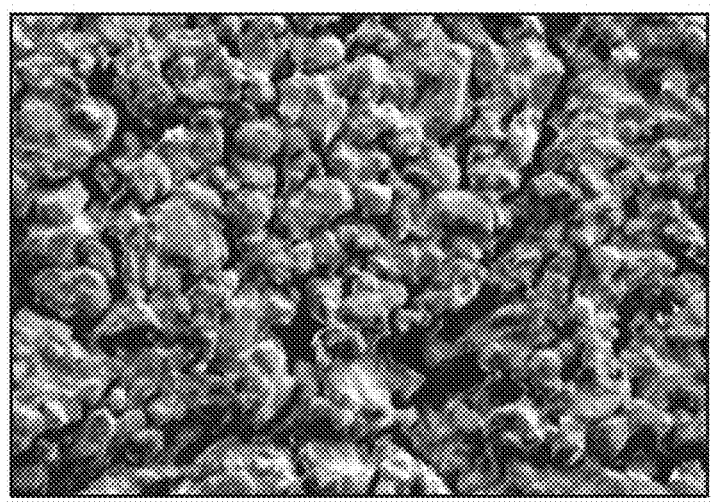
FIG. 12B is a micrograph (magnification of 3000) in the case where the substrate in Comparative Example 1 was burned at 1300° C.
Figure 13A:
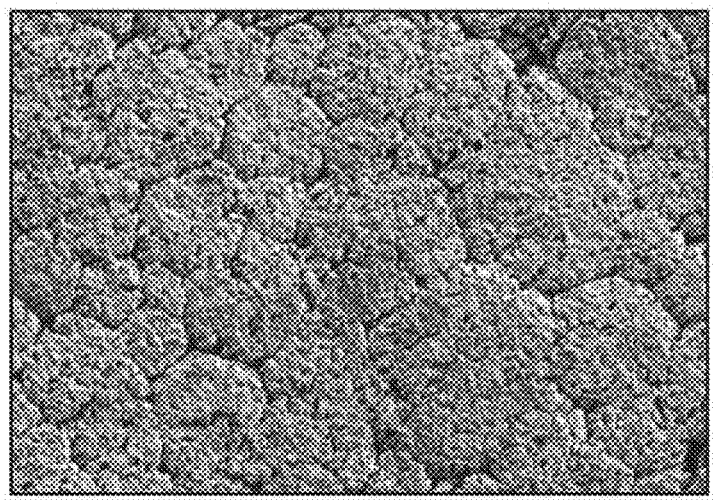
FIG. 13A is a micrograph (magnification of 500) in a case where the substrate in Comparative Example 1 was burned at 1350° C.
Figure 13B:
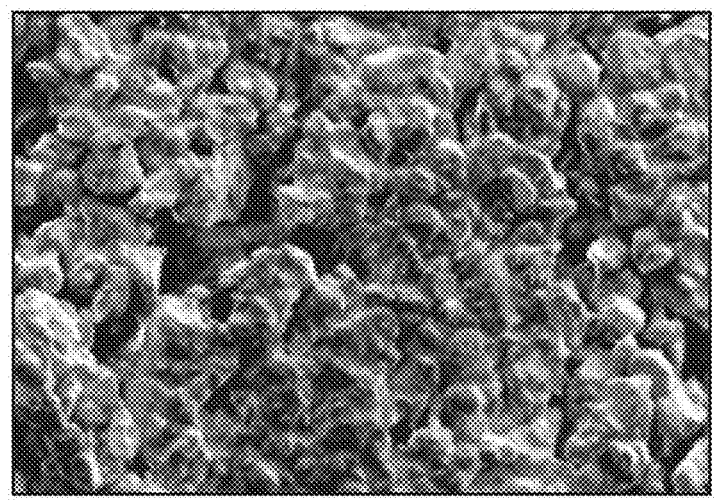
FIG. 13B is a micrograph (magnification of 3000) in the case where the substrate in Comparative Example 1 was burned at 1350° C.

FIGS. 12A to 13B show the exterior appearance of substrates in Comparative Example 1 that were produced from alumina granules (purity of alumina: 92%) having the median particle diameter of 1.5 µm. FIGS. 12A and 12B show data in the case where the burning temperature was 1300° C., and FIGS. 13A and 13B show data in the case where the burning temperature was 1350° C.

Throughout the figures, the photographs named with a last letter A were taken at a magnification of 500, and the photographs named with a last letter B were taken at a magnification of 3000.

Using the alumina granules having the median particle diameters of 0.2 µm and 0.6 µm has demonstrated as shown in FIGS. 8A to 11B that the substrates in Examples 1 and 2 containing minute air cavities can be produced. Further, it is ascertained as shown in FIGS. 8B, 9B, and 10B that in the case where the alumina granules having the median particle diameter of 0.6 µm were used, increasing the burning temperature from 1300° C. to 1350° C. and 1400° C. allowed the size of the air cavities to decrease and the air cavities were reliably left.

Figure 14:
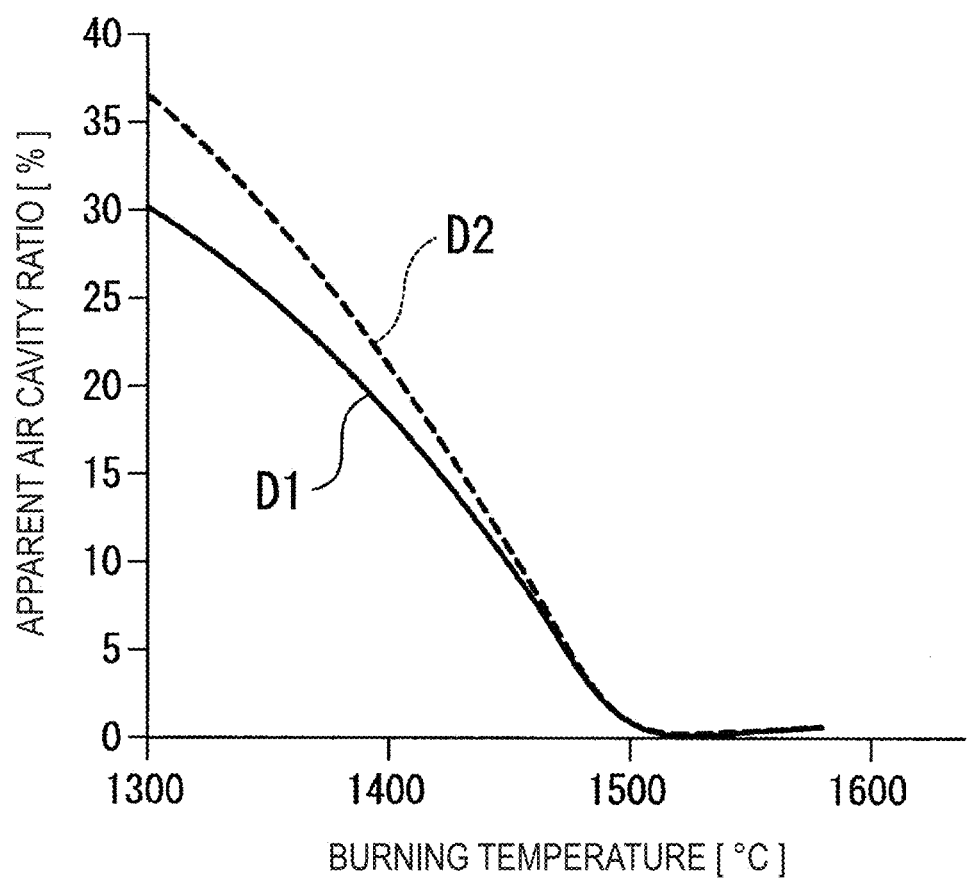
FIG. 14 shows graphs illustrating the relationship between the temperature at which alumina is burned and the apparent air cavity ratio of the alumina.

FIG. 14 shows graphs illustrating the relationship between the temperature at which the alumina is burned and the apparent air cavity ratio of the alumina.

The horizontal axis of FIG. 14 represents the burning temperature [° C.], and the vertical axis of FIG. 14 represents the apparent air cavity ratio [%]. The solid-line graph D1 represents data in the case where the median diameter of the alumina particles is 0.6 µm, and the broken-line graph D2 represents data in the case where the median diameter of the alumina particles is 1.5 µm.

When the temperature at which the alumina is burned is higher than 1450° C., the apparent air cavity ratio decreases to 10% or lower, as shown in FIG. 14. As a result, the reflectance of light reflected off the substrate 44 decreases, and the luminance of the fluorescence Y therefore decreases, as described above. The temperature at which the alumina is burned therefore needs to be 1450° C. or lower.

In contrast, when the alumina granules having the median particle diameter of 1.5 µm were used, the substrates in Comparative Example 1 that contain large air cavities were produced, as shown in FIGS. 12A to 13B. For example, comparison of the results shown in FIGS. 8B and 12B, in which the same burning temperature was used, with the results shown in FIGS. 9B and 13B, in which the same burning temperature was used, clearly indicates the differences in the alumina particles and the size of the air cavities. The substrate in Comparative Example 1 shown in FIG. 12B or 13B cannot achieve the desired reflectance or thermal conductivity.

The experimental results described above indicate that in the wavelength conversion element 40 in the present embodiment, the substrate 44 having high reflectance and high thermal conductivity can be achieved by an apparent air cavity ratio of the alumina greater than or equal to 10% and smaller than or equal to 30% and a median particle diameter of the alumina particles greater than or equal to 0.1 µm and smaller than or equal to 1.0 µm. Further, in this case, since the amount of fluorescence Y absorbed by the air cavities 441 and the alumina particles 443 is sufficiently small, setting the apparent air cavity ratio as described above allows high reflectance to be ensured. The thus produced wavelength conversion element 40 can produce high-intensity fluorescence Y.

According to the wavelength conversion element 40 in the present embodiment, since the substrate 44, which supports the wavelength conversion layer 43, functions as the reflection layer, no reflection layer needs to be separately provided. Further, since the wavelength conversion layer 43 is directly formed on the first surface 44a of the substrate 44, the thermal resistance between the wavelength conversion layer 43 and the substrate 44 can be suppressed to a small value.

The wavelength converter 30 in the present embodiment, which includes the wavelength conversion element 40 described above and the motor 60, allows the wavelength conversion element 40 to be efficiently cooled. The efficiency at which the excitation light E is converted into the fluorescence Y can therefore be increased.

The first light source apparatus 100 in the present embodiment, which includes the wavelength converter 30 in the present embodiment, can produce high-intensity fluorescence Y. Further, the projector 1 in the present embodiment, which includes the first light source apparatus 100 in the present embodiment, can produce a bright image.

The technical range of the invention is not necessarily limited to the embodiment described above, and a variety of changes can be made thereto to the extent that the changes do not depart from the substance of the invention.

For example, the aforementioned embodiment has been described with reference to the case where the light source apparatus (first light source apparatus 100) includes the wavelength converter including the wavelength conversion element and the motor. In place of the configuration described above, a configuration in which the light source apparatus includes no motor but includes the wavelength conversion element may be employed. That is, the light source apparatus may be configured to include a stationary wavelength conversion element.

In addition, the number, shape, material, arrangement, and other factors of each of the components that form the wavelength conversion element, the wavelength converter, and the light source apparatus can be changed as appropriate. In the embodiment described above, the projector including the three light modulators is presented by way of example. Instead, the invention is also applicable to a projector that displays color video images via a single light modulator. Further, as each of the light modulators, the liquid crystal panel described above is not necessarily used, and a digital mirror device can, for example, be used.

The shape, number, arrangement, material, and other factors of each of the components of the projector are not limited to those in the embodiment described above and can be changed as appropriate.

Further, in the embodiment described above, the case where the light source apparatus according to the embodiment of the invention is incorporated in a projector is presented, but not necessarily. The light source apparatus according to the embodiment of the invention can also be used, for example, in a lighting apparatus and an automobile headlight.

The entire disclosure of Japanese Patent Application No. 2017-112598, filed on Jun. 7, 2017 is expressly incorporated by reference herein.

What is claimed is:

1. A wavelength conversion element comprising:
   a wavelength conversion layer containing a plurality of phosphor particles and an inorganic binder that bonds the phosphor particles to each other; and
   a substrate that holds the wavelength conversion layer and contains alumina and air cavities,
   wherein the substrate has an apparent air cavity ratio that is greater than or equal to 10% and smaller than or equal to 30% and,
   wherein the substrate has a median diameter of particles of the alumina that is greater than or equal to 0.1 µm and smaller than or equal to 1.0 µm.

2. The wavelength conversion element according to claim 1, wherein the apparent air cavity ratio is greater than or equal to 15% and smaller than or equal to 25%.

3. A wavelength converter comprising:
   the wavelength conversion element according to claim 2; and
   a rotary driver that rotates the wavelength conversion element around an axis of rotation perpendicular to a surface of the substrate.

4. A light source apparatus comprising:
   the wavelength conversion element according to claim 2; and
   an excitation light source that outputs excitation light for exciting the wavelength conversion layer.

5. The wavelength conversion element according to claim 1, wherein the median particle diameter of the alumina particles is greater than or equal to 0.1 µm and smaller than or equal to 0.7 µm.

6. A wavelength converter comprising:
   the wavelength conversion element according to claim 5; and
   a rotary driver that rotates the wavelength conversion element around an axis of rotation perpendicular to a surface of the substrate.

7. A light source apparatus comprising:
the wavelength conversion element according to claim 5; and
an excitation light source that outputs excitation light for exciting the wavelength conversion layer.

8. A wavelength converter comprising:
the wavelength conversion element according to claim 1; and
a rotary driver that rotates the wavelength conversion element around an axis of rotation perpendicular to a surface of the substrate.

9. A light source apparatus comprising:
the wavelength converter according to claim 8; and
an excitation light source that outputs excitation light for exciting the wavelength conversion layer.

10. A projector comprising:
the light source apparatus according to claim 9;
a light modulator that modulates light from the light source apparatus in accordance with image information to form image light; and
a projection system that projects the image light.

11. A light source apparatus comprising:
the wavelength conversion element according to claim 1; and
an excitation light source that outputs excitation light for exciting the wavelength conversion layer.

12. A projector comprising:
the light source apparatus according to claim 11;
a light modulator that modulates light from the light source apparatus in accordance with image information to form image light; and
a projection system that projects the image light.

* * * * *